US005745429A

United States Patent [19]
Cowles et al.

[11] Patent Number: 5,745,429
[45] Date of Patent: Apr. 28, 1998

[54] MEMORY HAVING AND METHOD FOR PROVIDING A REDUCED ACCESS TIME

[75] Inventors: Timothy B. Cowles; Troy A. Manning; Todd A. Merritt, all of Boise, Id.

[73] Assignee: Micron Technology, Inc., Boise, Id.

[21] Appl. No.: 520,241

[22] Filed: Aug. 28, 1995

[51] Int. Cl.[6] .................................................. G11C 8/00
[52] U.S. Cl. ........................... 365/230.08; 365/189.05; 365/193; 365/194; 365/230.06; 365/236
[58] Field of Search .................................. 365/194, 193, 365/230.06, 230.08, 236, 189.05

[56] References Cited

U.S. PATENT DOCUMENTS 5,287,237  2/1994  Takasugi ................... 365/230.08 X

*Primary Examiner*—Do Hyun Yoo
*Attorney, Agent, or Firm*—Seed and Berry LLP

[57] ABSTRACT

A memory device includes an array of memory cells that are arranged in row and columns. A row latch receives a row address and a latch signal and stores the row address in response to a transition of the latch signal. A row decoder is coupled between the latch and the array. In response to a transition of a row address strobe, which occurs a first predetermined time after the transition of the latch signal, the row decoder fires a row of the memory cells that are identified by the row address.

25 Claims, 7 Drawing Sheets

MEMORY HAVING AND METHOD FOR PROVIDING A REDUCED ACCESS TIME

TECHNICAL FIELD

The present invention relates generally to memory devices and more specifically to a memory device having a reduced data access time during a read cycle.

BACKGROUND OF THE INVENTION

Computer designers continue to search for faster memory devices that will allow them to design faster computer systems. Typically, a computer system's operating speed depends upon the time required to transfer, i.e., read or write, data between a processor and a memory circuit or device, such as a dynamic random access memory (DRAM). Such a memory device usually includes a large number of memory cells that are arranged in rows and columns. These cells store both data for the processor to operate on and the results of such operations. Therefore, the more quickly the processor can access the data within these memory cells, the more quickly it can perform a calculation or execute a program that uses this data.

Typically, to read data from such a memory device, a computer processor or other addressing circuit generates row and column addresses on an address bus and row and column address strobes (RAS and CAS, respectively) on respective strobe lines. The data that the memory device provides to the processor, i.e., the data read by the processor, is stored in the memory cells that are part of both the selected rows and the corresponding selected columns. Such a memory device can often operate in at least four read modes or cycles: nibble, burst extended data out (EDO), page mode, and conventional read.

Referring to FIG. 1, a timing diagram of a conventional read cycle is shown for example purposes. A processor (not shown) or associated circuitry generates the control signals $\overline{RAS}$, $\overline{CAS}$, write enable ($\overline{WE}$) and ADDRESS. (A bar over the signal name indicates that the signal is active when its logic level is low, i.e., at a logic 0.) Initially, the processor drives $\overline{WE}$ to an inactive level, here a logic 1, to indicate to the memory device that a read cycle follows. The processor then drives a row address onto the ADDRESS bus, and the memory latches the row address in response to a transition of $\overline{RAS}$ from an inactive level, here logic 1, to an active level, here logic 0. Such a transition may also be referred to as a falling edge of $\overline{RAS}$. The processor then drives a column address onto the ADDRESS bus. In response to the falling edge of $\overline{CAS}$, the memory latches the column address, and places on the DATA bus the data from the memory cell located at the intersection of the addressed column and row. The processor then transitions $\overline{CAS}$ from an active level, here logic 0, to an inactive level, here logic 1, to disable the memory from placing data onto the DATA bus. Such a transition may also be referred to as the rising edge of $\overline{CAS}$. A predetermined time later, the processor transitions $\overline{RAS}$ to an inactive logic 1 for at least a predetermined time $t_{RP}$ before transitioning $\overline{RAS}$ to an active logic 0 to begin the next cycle. Thus, as shown, the conventional read mode is typically used to address a single column in a row.

Still referring to FIG. 1, and using for example purposes a 66 MHz clock, i.e., a clock having a period of approximately 15 nanoseconds, the conventional read cycle takes approximately 9 clock cycles, i.e., 150 nanoseconds. The $t_{RAC}$ time, which is the duration between the falling edge of $\overline{RAS}$ and the time when the memory device first places valid data onto the DATA bus, is in the approximate range of 50–60 nanoseconds. The time $t_{RP}$, which is the time that $\overline{RAS}$ must be at an inactive logic level before the start of the next cycle, is in the approximate range of 30–40 nanoseconds.

Attempts to decrease the cycle and $t_{RAC}$ times for the conventional read mode and other read modes have focused on increasing the frequency of the system clock. With today's integrated circuit technology, however, the frequency of the clock is limited by the propagation delay and other delays associated with such memory devices. Furthermore, such attempts often increase the amount of standby current that the memory device draws. Typically, the standby current is the current drawn by the memory device before $\overline{RAS}$ transitions to fire the row.

SUMMARY OF THE INVENTION

In accordance with one aspect of the present invention, a memory device is provided. The memory device includes an array of memory cells that are arranged in rows and columns. A row latch receives a row address and a latch signal and stores the row address in response to a transition of the latch signal. A row decoder is coupled between the latch and the array. In response to a transition of a row address strobe, which occurs a first predetermined time after the transition of the latch signal, the row decoder fires a row of the memory cells that are identified by the row address.

In another aspect of the invention, the latch signal comprises a write enable signal.

In still another aspect of the invention, the memory device includes an address buffer that receives the row address and a prefetch signal. The address buffer couples the row address to the latch in response to a transition of the prefetch signal. A delay circuit is coupled to the row latch and receives the prefetch signal. The delay circuit generates the transition of the latch signal a second predetermined time after the transition of the prefetch signal.

In yet another aspect of the invention, the memory includes a column latch that receives a column address and a column address strobe. The column latch stores the column address in response to a transition of the column address strobe. A column decoder is coupled between the column latch and the array, and fires a column of the memory cells that are identified by the column address.

An advantage provided by the present invention is a reduction in the read-cycle and $t_{RAC}$ times without a corresponding increase in the clock frequency or an increase in the standby current.

DETAILED DESCRIPTION OF THE INVENTION

Figure 1:
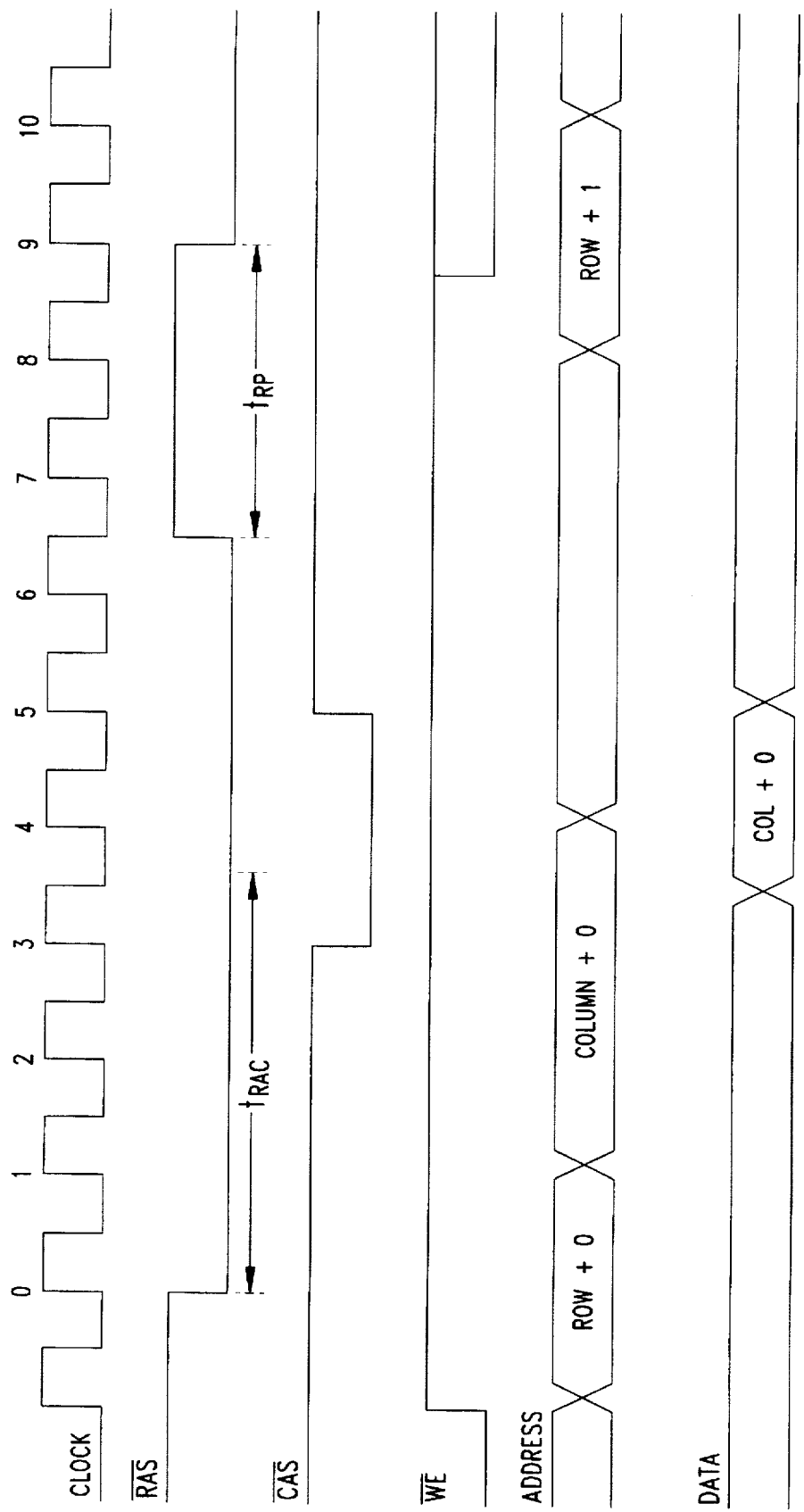
FIG. 1 is a timing diagram of a known conventional read cycle.
Figure 2:
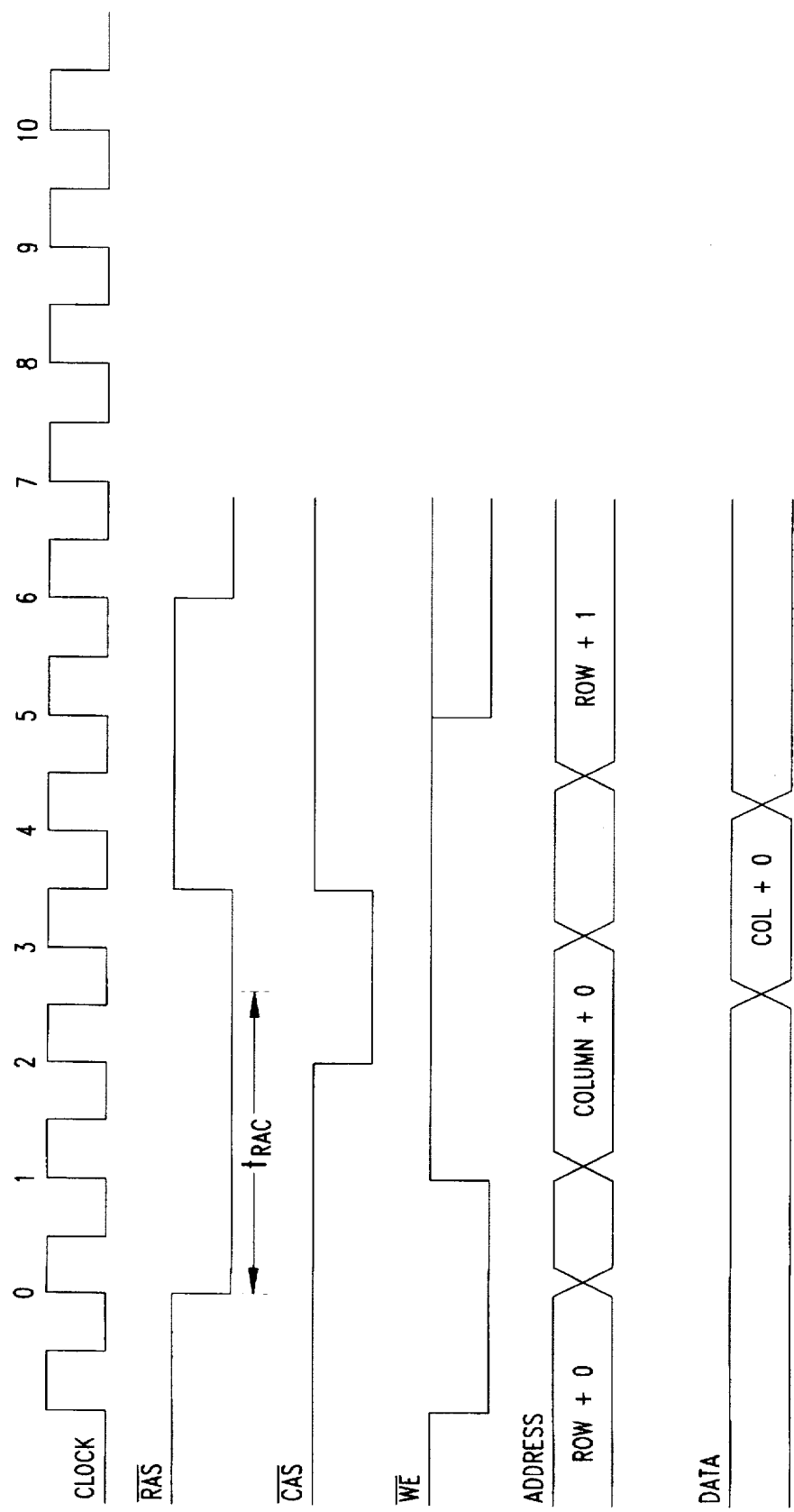
FIG. 2 is a timing diagram of a conventional read cycle according to the present invention.
Figure 6:
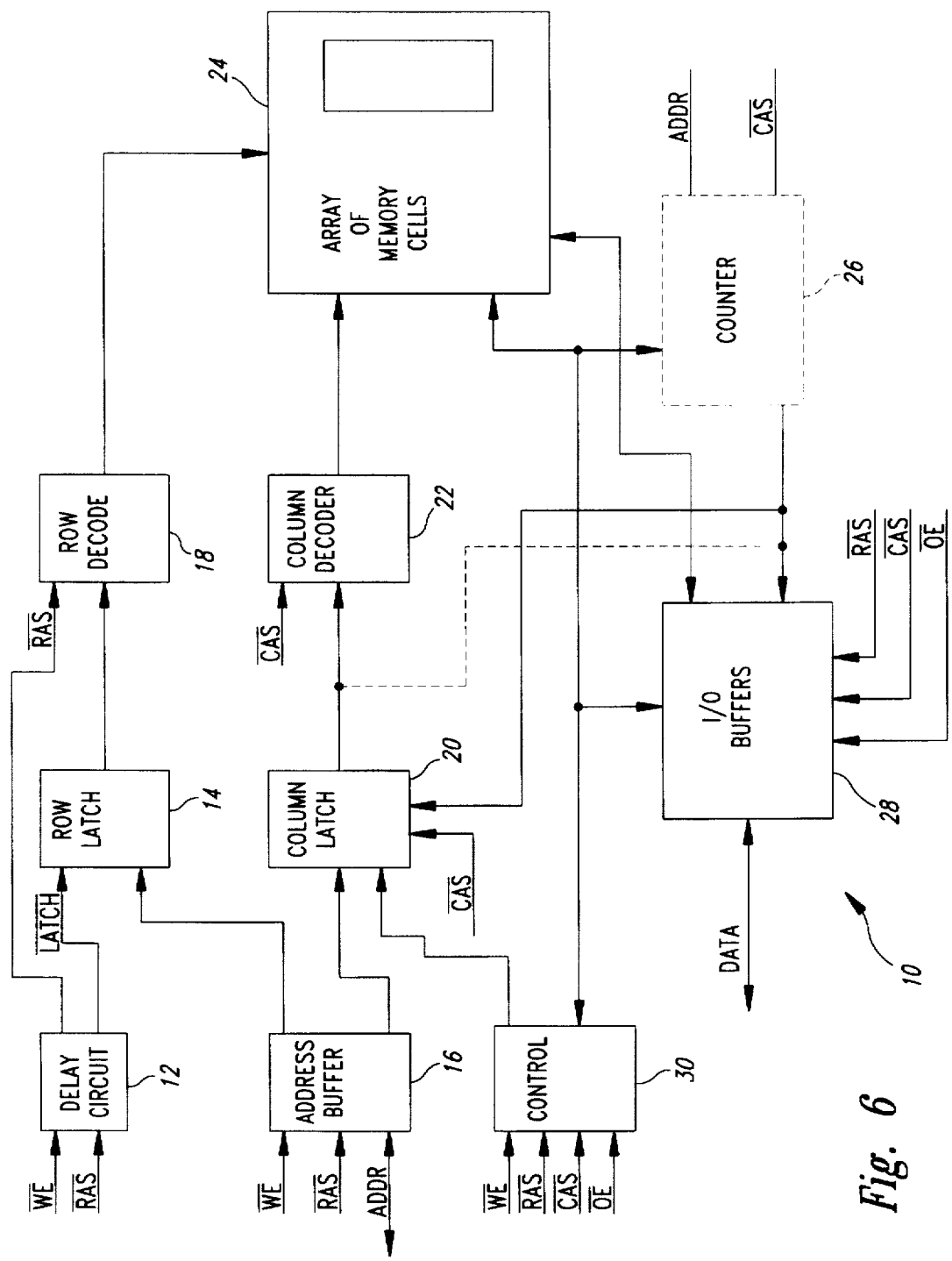
FIG. 6 is a block diagram of a memory device according to the present invention.

FIG. 2 is a timing diagram of a conventional read cycle according to the present invention. Unlike the known conventional read cycle of FIG. 1, the memory device 10 (FIG. 6) latches the row address in response to a transition of $\overline{WE}$ or another signal (besides $\overline{RAS}$) that occurs a predetermined time before the first transition of $\overline{RAS}$. Such prelatching, i.e., prefetching, of the row address allows it to be stored and to propagate through the row decoder 18 (FIG. 6) so that in response to the first transition of $\overline{RAS}$, the row decoder 18 need only generate a firing signal to fire the addressed row of memory cells in the memory-cell array 24 (FIG. 6). Thus, as opposed to the row decoder 18 firing the addressed row approximately 25–30 nanoseconds (ns) after the first transition of $\overline{RAS}$, the row decoder 18 fires the row approximately 5–10 ns after this transition. Thus, prefetching the row address in accordance with the invention results in a decrease of approximately 20 ns in both the firing time and $t_{RAC}$ without an increase in the clock frequency. Furthermore, prefetching the row address does not increase the memory's end-lot current, and thus does not cause the memory device to exceed its standby current limit.

Still referring to FIG. 2, the processor (not shown) places a row address, here row+0, on the ADDRESS bus. Next, the processor generates the falling edge of $\overline{WE}$. In response to this falling edge, the memory device 10 latches, i.e., stores, the row address. As stated above, the row address then propagates through the row decoder 18. At a predetermined time after it generates the falling edge of $\overline{WE}$, the processor generates the falling edge of $\overline{RAS}$. In this embodiment of the invention, the predetermined time is approximately one clock cycle, i.e., 15 ns, although it may be different in other embodiments of the invention. In response to the falling edge of $\overline{RAS}$, the row decoder 18 generates a firing signal that fires the row of memory cells in the array 24 that is identified by, i.e., corresponds to, the stored row address.

Next, the processor drives the column address, here column+0, onto the DATA bus, and generates the falling edge of $\overline{CAS}$. In response to this falling edge, the memory device 10 stores the column address and fires the corresponding column of memory cells in the array 24. In addition to firing the addressed column of memory cells, the memory device 10 also places the data stored in the memory cell that is located at the intersection of the addressed row and column onto the DATA bus for the processor to read. At some time later, the processor transitions $\overline{CAS}$ and $\overline{RAS}$ to inactive levels. The sequence of these transitions is unimportant, but the read cycle is ended when both $\overline{RAS}$ and $\overline{CAS}$ have returned to an inactive level. The processor then transitions $\overline{WE}$ to a logic low and then to a logic high to begin another read cycle, or transitions $\overline{WE}$ to and maintains $\overline{WE}$ at a logic low to begin a write cycle.

Still referring to FIG. 2, and using for example a 66 MHz clock frequency, the conventional read cycle takes approximately 6 clock cycles or 90 ns. This a 45–60 ns reduction from the approximately 135–150 ns shown in FIG. 1 for the known conventional read cycle. Furthermore, $t_{RAC}$ is reduced approximately 20 ns, from 50–60 ns to 30–40 ns.

Figure 3:
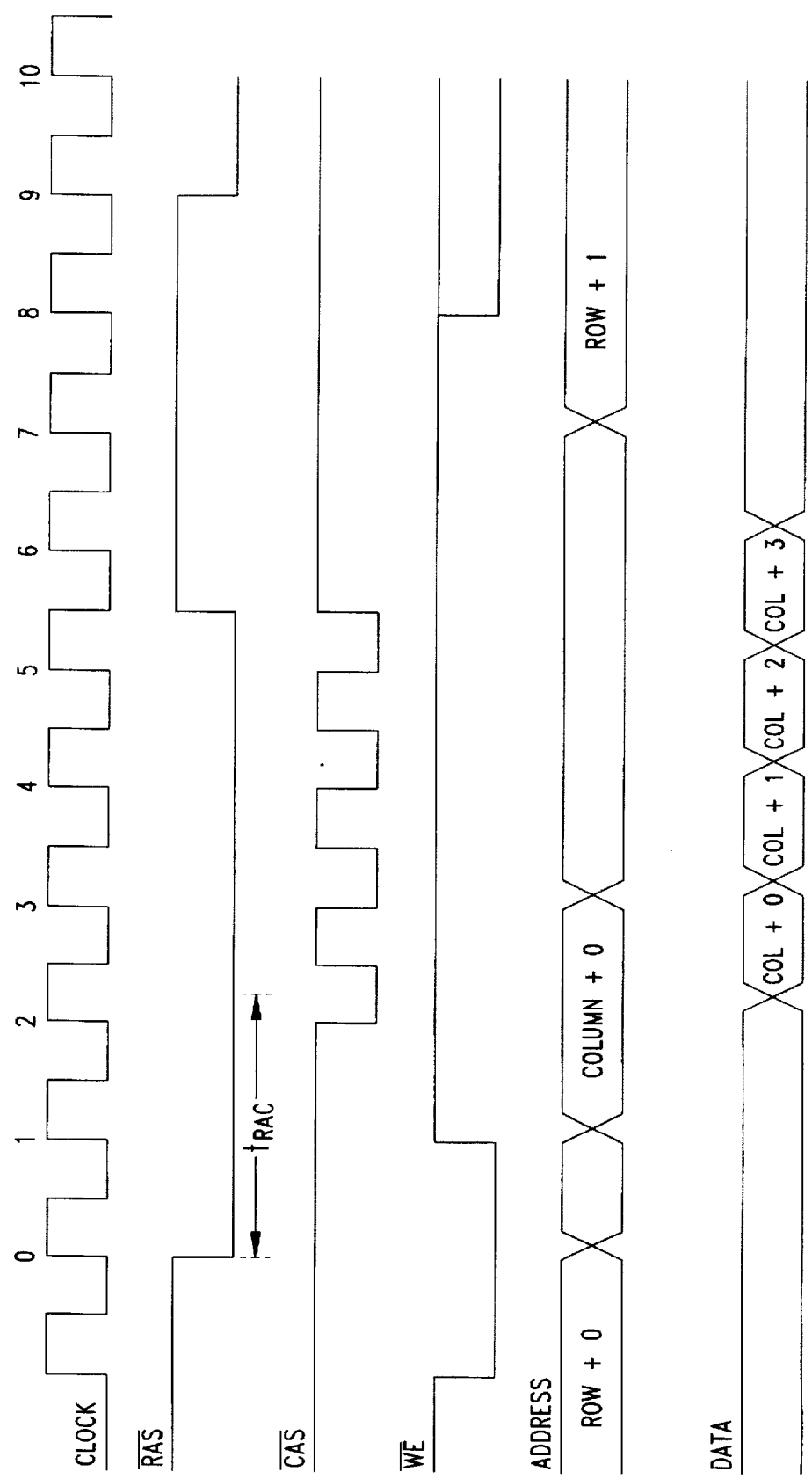
FIG. 3 is a timing diagram of a nibble EDO read cycle according to the present invention.

FIG. 3 is timing diagram of a nibble EDO read cycle according to the present invention. As shown, in response to the falling edge of $\overline{WE}$, the memory device 10 latches a row address, here row to, from the ADDRESS bus. The latched row address then propagates through the row decoder 18. Next, in response to the falling edge of $\overline{RAS}$, which occurs a predetermined time after the falling edge of $\overline{WE}$, the row decoder 18 fires the addressed row of memory cells in the array 24. In this embodiment of the invention, this predetermined time is approximately one clock cycle, i.e., 15 ns, although it may be different in other aspects of the invention.

Next, in response to the first falling edge of $\overline{CAS}$, the memory device 10 latches a base column address, here column+0, and accesses data stored in the addressed row and column. The memory device 10 also accesses additional data that is stored in memory cells located in the addressed row and in additional columns that are identified by column addresses that are indexed with respect to the base column address. In this embodiment, there are three additional columns, here column+1, column+2, and column+3, that are respectively indexed by 1, 2, and 3 with respect to the base column address, column+0. Furthermore, in response to the first falling edge of $\overline{CAS}$, the memory device 10 places onto the DATA bus the data stored at column+0. In response to the next three falling edges of $\overline{CAS}$, the memory 10 device places onto the DATA bus the data stored in column+1, column+2, and column+3 respectively. The processor then transitions both $\overline{RAS}$ and $\overline{CAS}$ (either simultaneously or at different times) to an inactive logic 1 to end the read cycle. The read cycle ends, i.e., the memory device 10 is disabled from placing valid data onto the DATA bus, when both $\overline{RAS}$ and $\overline{CAS}$ have returned to inactive logic levels. Then, the processor may transition $\overline{WE}$ as discussed above in conjunction with FIG. 1 to begin the next read or write cycle.

Still referring to FIG. 3, and using for example a 66 MHz clock frequency, $t_{RAC}$ is reduced approximately 20 ns from that of known nibble read cycles, from 50–60 ns to 30–40 ns.

Furthermore, although shown accessing four columns (the base column and three indexed columns), the nibble EDO read cycle can access more or fewer columns without departing from the spirit and scope of the invention.

Figure 4:
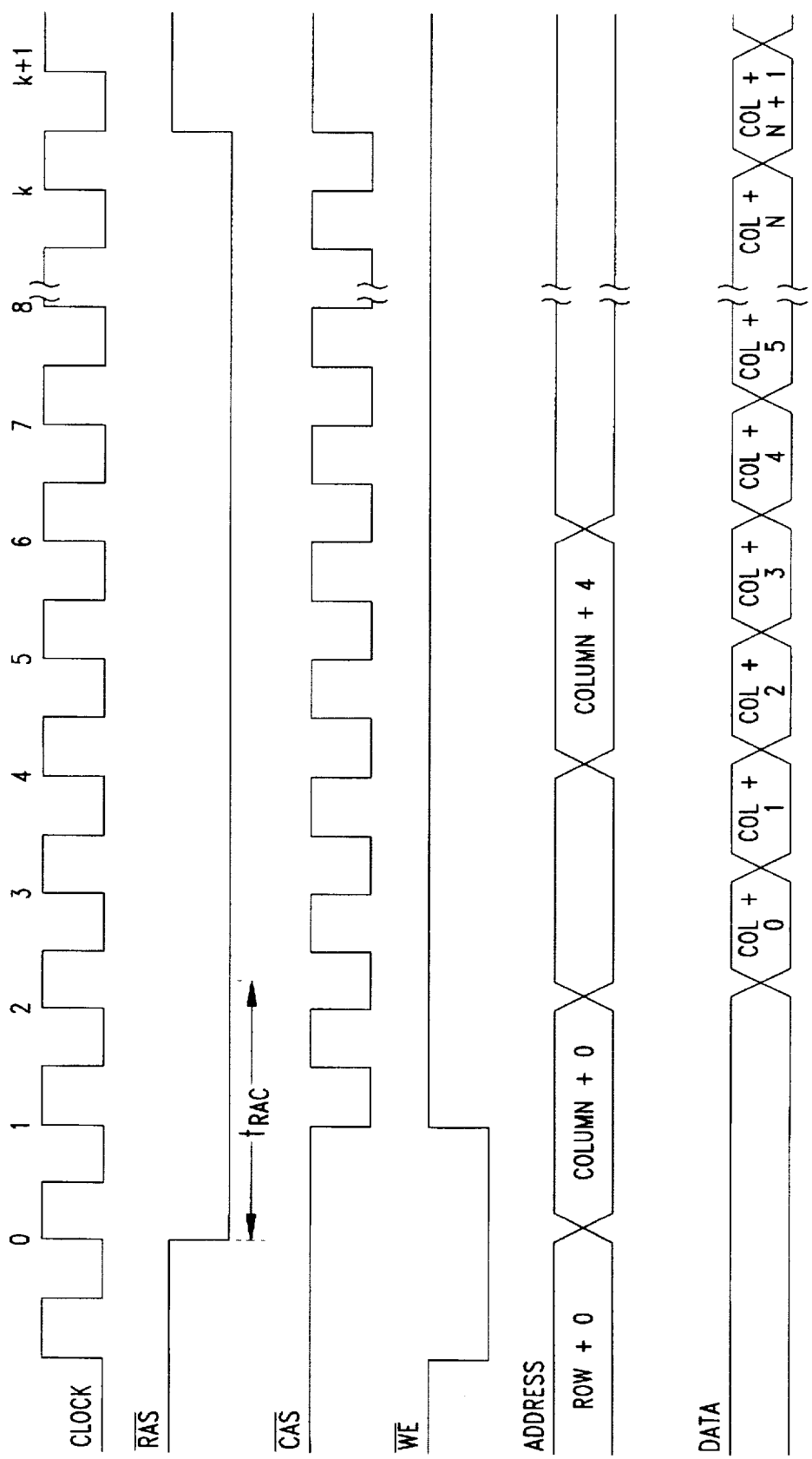
FIG. 4 is a timing diagram of a burst EDO read cycle according to the present invention.

FIG. 4 is a timing diagram of a burst EDO read cycle according to the present invention. In response to the falling edge of $\overline{WE}$, the memory device 10 latches the row address. Next, in response to the falling edge of $\overline{RAS}$, which occurs a predetermined time after the falling edge of $\overline{WE}$, the row decoder 18 fires the addressed row. In this embodiment of the invention, this predetermined time is approximately one clock cycle, i.e., 15 ns, although it may be different in other embodiments of the invention.

In response to the first falling edge of $\overline{CAS}$, the memory device 10 latches the base column address, here column+0. In response to the next falling edge of $\overline{CAS}$, the memory device 10 drives the DATA bus with the data stored at the addressed row and the base column. Additionally, the memory device 10 updates the stored base address to a first updated, i.e., indexed, column address. In this embodiment of the invention, the memory device 10 increments the base column address by 1 to update it. In other embodiments, however, the memory device 10 may otherwise mathematically manipulate the base column address to update it. In response to the next falling edge of $\overline{CAS}$, the memory device 10 drives the DATA bus with the data stored at the addressed row and the first indexed column, column+1. Additionally, the memory device 10 updates the first indexed column address to a second indexed column address, column+2. In response to the next falling edge of $\overline{CAS}$, the memory device 10 drives the DATA bus with the data stored at the addressed row and the second indexed column, column+2. Additionally, the memory device 10 updates the second indexed column address to a third indexed column address, column+3. In response to the next falling edge of $\overline{CAS}$, the memory device 10 latches a new base column address, here column+4. Additionally, the memory device 10 places on the DATA bus the data stored at the addressed row and the third indexed column, column+3. This sequence may continue for any additional number of columns until the processor has read all the columns in the addressed row. The burst EDO read cycle ends when both $\overline{CAS}$ and $\overline{RAS}$ have returned to inactive high levels.

As shown, using for example a 66 MHz clock frequency, $t_{RAC}$ is reduced by approximately 20 ns from that of known burst EDO cycles, from 50–60 ns to 30–40 ns.

Although in this embodiment of the burst EDO read cycle the memory device 10 accessing bus four columns per base column address, other numbers of columns may be accessed per base column address without departing from the spirit and scope of the invention.

Figure 5:
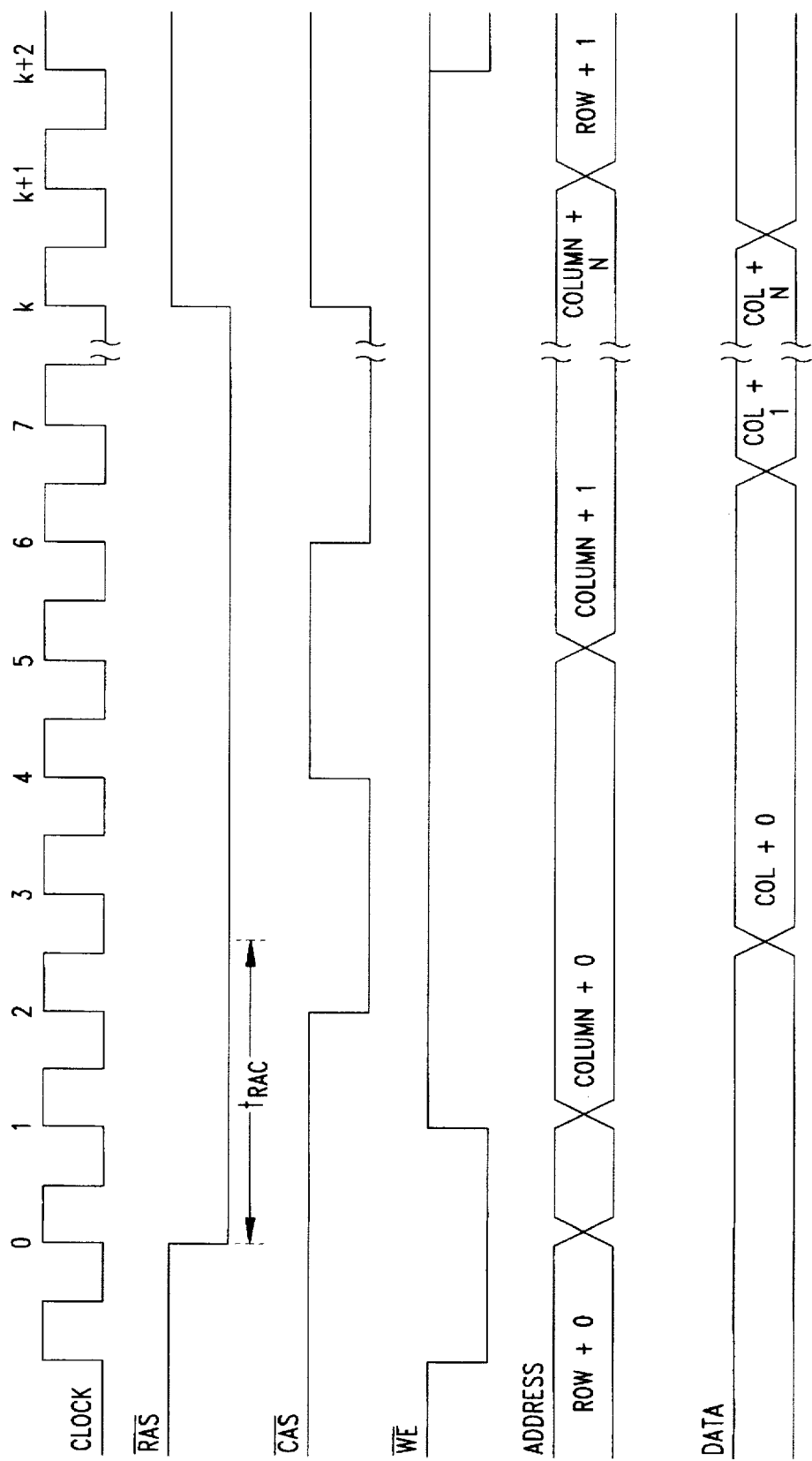
FIG. 5 is a timing diagram of a page mode EDO read cycle according to the present invention.

FIG. 5 is a timing diagram of a page mode EDO read cycle according to the present invention. In response to the falling edge of $\overline{WE}$, the memory device 10 stores a row address, here row+0. In response to the falling edge of $\overline{RAS}$, which occurs a predetermined time after the falling edge of $\overline{WE}$, the row decoder 18 fires the row identified by the row address. In this embodiment of the invention, this predetermined time is approximately one clock cycle, i.e., 15 ns, although it may be different in other aspects of the invention.

In response to the first falling edge of $\overline{CAS}$, the memory device 10 latches a first column address, here column+0, and drives the DATA bus with the data stored at the addressed row and the first column. In response to the next falling edge of $\overline{CAS}$, the memory device 10 latches a second column address, here column+1, and drives the DATA bus with the data stored at the addressed row and the second column. This sequence continues until the end of the read cycle, when both $\overline{RAS}$ and $\overline{CAS}$ have returned to inactive high levels. As shown, any number of columns within the addressed row can be accessed during a page mode EDO read cycle.

As shown, using for example a 66 MHz clock frequency, $t_{RAC}$ is reduced approximately 20 ns from that of known page EDO read cycles, from 50–60 nanoseconds to 30–40 nanoseconds.

FIG. 6 is a block diagram of the memory device 10 according to the present invention. The memory device 10 is coupled to signal lines that carry $\overline{WE}$, $\overline{RAS}$, $\overline{CAS}$, and an output enable signal $\overline{OE}$, an ADDRESS bus that carries the row and column addresses, and a DATA bus. A processor or associated circuitry (not shown) drives the signal lines and the ADDRESS bus, and reads data from and writes data to the memory device 10 via the DATA bus.

The memory device 10 includes a delay circuit 12 that receives a prefetch signal, here $\overline{WE}$, and $\overline{RAS}$. The row address latch 14 receives a signal $\overline{LATCH}$ from the delay circuit 12 and a buffered row address from an address buffer 16, which receives $\overline{WE}$, $\overline{RAS}$, and ADDRESS. As discussed below, when the memory device 10 is in the prefetch mode, the delay circuit 12 delays the edge of $\overline{WE}$ a predetermined time that is sufficient to allow the row address to propagate through the buffer 16 to the input of the latch 14 before the latch 14 stores the row address. The row decoder 18 receives the latched address from the row latch 14 and $\overline{RAS}$ from the delay circuit 12. A column latch 20 receives $\overline{CAS}$ and a buffered column address from the address buffer 16. A column decoder 22 receives the latched column address from the column latch 20. The array 24 of memory cells receives a row firing signal from the row decoder 18 and a column firing signal from the column decoder 22. An optional counter 26 receives ADDRESS and $\overline{CAS}$. Input/Output (I/O) buffers 28 receive data from the array 24, a count value from the counter 26, $\overline{RAS}$, $\overline{CAS}$, and $\overline{OE}$. The buffers 28 also place the data from the array 24 onto the DATA bus. A control circuit 30 receives $\overline{WE}$, $\overline{CAS}$, $\overline{RAS}$ and $\overline{OE}$, and provides control signals to the column latch 20, the array 24, the counter 26, and the buffers 28. When active low, $\overline{OE}$ enables both the control circuit 30 and the buffers 28.

In another embodiment of the invention, both the delay circuit 12 and the address buffer 16 are omitted, and the prefetch signal is coupled directly to the latch input of the row latch 14. Thus, in such an embodiment, $\overline{LATCH}$ is equivalent to the prefetch signal, $\overline{WE}$.

In operation, the memory device 10 is constructed such that it can operate in the known mode where, in response to the first falling edge of $\overline{RAS}$, the row latch 14 stores the row address and the row decoder 18 is enabled to fire the addressed row. The memory 10 can also operate in a mode according to the present invention, where, in response to an edge of a prefetch signal which is the falling edge of $\overline{WE}$ in this embodiment, the row latch 14 stores the row address, and, in response to the falling edge of $\overline{RAS}$, the row decoder 18 fires the addressed row. In another embodiment of the invention, $\overline{OE}$ is the prefetch signal. For clarity, only the mode of operation in accordance with the present invention is discussed in detail.

Still referring to FIG. 6, during the conventional read cycle illustrated in FIG. 2, the address buffer 16 latches the row address in response to the first falling edge of $\overline{WE}$. The delay circuit 12 generates a falling edge of $\overline{LATCH}$ a predetermined delay time after the falling edge of $\overline{WE}$. This delay time is sufficient to allow the row address to propagate through the address buffer 16 and to the input of the row latch 14 before the row latch 14 latches the address. In one aspect of the invention, this delay time is approximately 5 ns. Where the address buffer is omitted (the ADDRESS bus is coupled directly to row latch 14), the delay circuit 12 may be omitted also ($\overline{WE}$ is coupled directly to row latch 14). Furthermore, when operating in the known mode, the delay circuit 12 may generate the falling edge of $\overline{LATCH}$ approximately 5 ns after the falling edge of $\overline{RAS}$, and may delay the falling edge of $\overline{RAS}$ output to the row decoder 18 a time sufficient to allow the row address to propagate through the latch 14. The latched address then propagates through the circuitry of the row decoder 18, which is not yet enabled to fire the addressed row in the array 24. The falling edge of $\overline{RAS}$ enables the row decoder 18 to generate a firing signal to fire the addressed row of array 24. At some time later, $\overline{WE}$ returns to a logic high to indicate to the memory 10 that the processor is initiating a read cycle.

Next, in response to the falling edge of $\overline{CAS}$, the column latch 20 stores the column address, which propagated from the ADDRESS bus through the address buffer 16. Also in response to the falling edge of $\overline{CAS}$, the column decoder 22 generates a firing signal to fire the addressed column of memory cells in the array 24. The array 24 couples to one of the buffers 28 the data stored in the memory cell that is located at the intersection of the addressed row and column. The counter 26, which also latches as a count value the column address in response to the falling edge of $\overline{CAS}$, provides this address to the buffers 28 to select and enable the corresponding buffer both to receive the data from the array 24 and to drive the data onto the DATA bus. In response to the rising edge of $\overline{CAS}$, the selected output buffer 28 is disabled from further coupling data to the DATA bus. After both $\overline{CAS}$ and $\overline{RAS}$ have gone inactive high, the read cycle is ended.

In another embodiment of the invention that is compatible with the conventional read cycle of FIG. 2, the counter 26 is omitted. In such an embodiment, the output of the column latch 20 is coupled to the count input of the buffers 28. Thus, the correct buffer 28 is selected using the column address from the column latch 20 instead of the count value from the omitted counter 26.

Still referring to FIG. 6, in operation during the nibble EDO read cycle of FIG. 3, the address buffer 16 latches the row address in response to the falling edge of $\overline{WE}$, and the row decoder 18 fires the word line in response to the falling edge of $\overline{RAS}$. In response to the first falling edge of $\overline{CAS}$, the column latch 20 stores the base column address from the address buffer 16. The column decoder 22 provides a column firing signal to the array 24. The control circuit 30 provides the appropriate control signals to the array 24 such that it accesses the base column and also a number of additional columns whose addresses are indexed with respect to the base column address. As shown in the embodiment of the invention of FIG. 3, the array 24 accesses three indexed columns in addition to the base column. The array 24 then couples the data from the base and the indexed columns to the buffers 28. The counter 26 stores as a count value the base column address, and the buffers 28 place onto the DATA bus the data stored in the memory cell located at the addressed row and the base column.

In response to the second falling edge of $\overline{CAS}$, the counter updates its count value, here incrementing it by one, and provides this updated count value to the buffers 28. The buffers 28 place onto the DATA bus the data from the first indexed column, column+1. In response to the third and fourth falling edges of $\overline{CAS}$, the buffers 28 place onto the DATA bus the data from the remaining indexed columns, column+2 and column+3.

Still referring to FIG. 6, in operation during the burst EDO read cycle of FIG. 4, the row latch 14 latches the row address in response to the falling edge of $\overline{WE}$. In response to the falling edge of $\overline{RAS}$, the row decoder 18 fires the wordline of the addressed row of memory cells in the array 24. The controller 30 generates the appropriate control signals such that in response to the first falling edge of $\overline{CAS}$, the column latch 20 stores the base column address, column+0, from the ADDRESS bus via the address buffer 16, and the counter 26 updates the base column address and stores as a count value this updated address, column+1.

In response to the second falling edge of $\overline{CAS}$, the array 24 couples the data from the addressed row and the base column, column+0, to one of the buffers 28, which places this data onto the DATA bus. Additionally, the column latch 20 latches the updated count value, column+1, and the counter updates its count value to column+2. This sequence continues in response to the succeeding falling edges of $\overline{CAS}$ until the count value has updated the count value a predetermined number of times, here three.

On the next falling edge of $\overline{CAS}$ following this predetermined number of count updates, the column latch 20 latches the next base column address from the ADDRESS bus, and the counter 26 updates this base column address as describe above.

In another embodiment of the invention, the column latch 20 does not receive the column address from the address buffer 16, but instead receives it from the counter 26. That is, the base column address propagates through the counter 26 and into the column latch 20. In response to the first falling edge of $\overline{CAS}$, the column latch 20 latches the base column address and the counter 26 updates the base column address. The operation regarding the indexed column addresses proceeds in the same manner as described above.

Still referring to FIG. 6, during the page mode EDO read cycle of FIG. 5, the row latch 14 latches the row address in response to the falling edge of $\overline{WE}$, and the row decoder 18 fires the addressed row in response to the falling edge of $\overline{RAS}$. In response to the first falling edge of $\overline{CAS}$, the column latch 20 latches the column address from the ADDRESS bus, and the column decoder 22 fires the addressed column in the array 24. Additionally, the array 24 couples the data from the addressed row and column to the buffers 28, which place the data onto the DATA bus. In response to the next falling edge of $\overline{CAS}$, the column latch latches the next column address, which the processor has placed onto the ADDRESS bus, and the column decoder 22 fires the addressed column in the array 24. The array 24 couples the data from the addressed row and column to one of the data buffers 28, which places the data onto the DATA bus. This sequence continues until all the columns in the address row have been accessed, or until both $\overline{RAS}$ and $\overline{CAS}$ have returned to an inactive logic level to end the read cycle. As shown, the counter 26 is not used during the page mode EDO read cycle, and thus may be omitted.

Although specific embodiments of the memory device 10 have been discussed, other embodiments may be used without departing from the spirit and scope of the invention.

Figure 7:
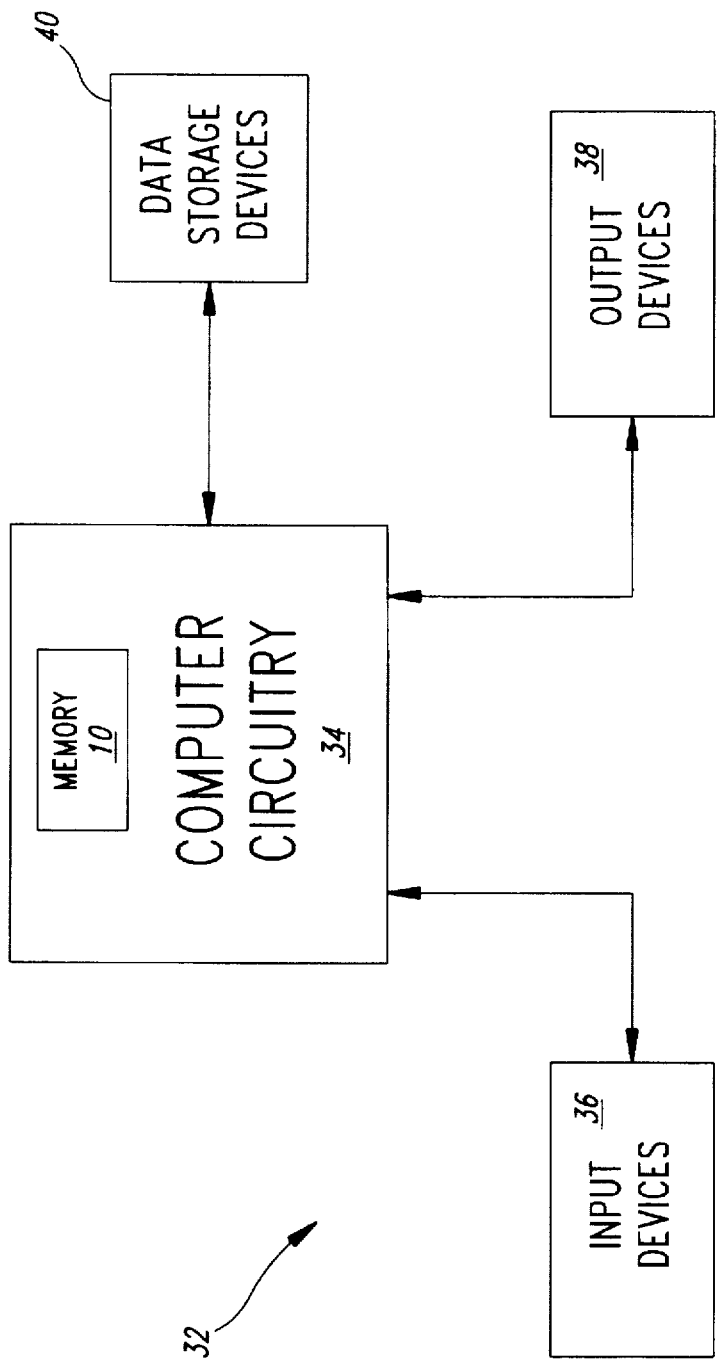
FIG. 7 is a block diagram of a computer system that incorporates the memory device of FIG. 6.

FIG. 7 is a block diagram of a computer system 32 that uses the memory device 10 of FIG. 6. The computer system 32 includes computer circuitry 34 for performing computer functions, such as executing software to perform desired calculations and tasks. The circuitry 34 typically includes a processor (not shown) and the memory 10 as shown. One or more input devices 36, such as a keypad or a mouse, are coupled to the computer circuitry 34 and allow an operator (not shown) to manually input data thereto. One or more output devices 38 are coupled to the computer circuitry 34 to provide to the operator data generated by the computer circuitry 34. Examples of output devices 38 include a printer and a video display unit. One or more data storage devices 40 are coupled to the computer circuitry 34 to store data on or retrieve data from external storage media (not shown). Examples of the storage devices 40 and corresponding storage media include drives that accept hard and floppy disks, tape cassettes, and compact disk read-only memories (CD-ROMs). Typically, the computer circuitry 34 generates the ADDRESS, $\overline{RAS}$, $\overline{CAS}$, $\overline{WE}$, and $\overline{OE}$ signals as well as other signals. The computer circuitry 34 is coupled to the ADDRESS and DATA buses and the control lines of the memory 10 as shown in FIG. 6.

It will be appreciated that, although specific embodiments of the invention have been described herein for purposes of illustration, various modifications may be made without departing from the spirit and scope of the invention. Accordingly, the invention is not limited except as by the appended claims.

We claim:

1. A memory device, comprising:

an array of memory cells arranged in rows and columns;

a row decoder coupled to said array said row decoder operable to receive a row address and a row address strobe and operable to fire a row of said memory cells in response to a transition of said row address strobe, said row being identified by said row address, and a row latch coupled to said row decoder said row latch operable to receive said row address and a latch signal and operable to provide said row address to said row decoder said row latch operable to store said row address in response to a transition of said latch signal that occurs a first predetermined time before said transition of said row address strobe.

2. The memory device of claim 1 wherein said latch signal comprises a prefetch signal.

3. The memory device of claim 1 further comprising:

an address buffer operable to receive said row address and a prefetch signal and operable to provide said row address to said latch in response to a transition of said prefetch signal; and a delay circuit coupled to said row latch and operable to receive said prefetch signal and operable to generate said transition of said latch signal a second predetermined time after said transition of said prefetch signal.

4. The memory device of claim 1 further comprising:

a column latch operable to receive a column address and a column address strobe and operable to store said column address in response to a transition of said column address strobe; and a column decoder coupled to said column latch and to said array and operable to fire a column of said memory cells, said column being identified by said column address.

5. The memory device of claim 1 further comprising:

a control circuit coupled to said array;

a column latch coupled to said control circuit and operable to receive a base column address and a column n address strobe and operable to store said base column address in response to a transition of said column address strobe;

a column decoder coupled to said column latch and to said array and operable to fire a column of memory cells, said column being identified by said base column address, said column decoder operable to fire additional columns of memory cells, said additional columns being identified by a number of column addresses that are indexed with respect to said base column address;

a plurality of buffers coupled to said control circuit and to said array, each buffer operable to store data from a memory cell located in said fired row and one of said fired columns and to output said data when addressed by a count value in response to a corresponding one of said transition of said column address strobe and a number of subsequent transitions of said column address strobe; and a counter coupled to said buffers and to said control circuit, said counter operable to receive said base column address and said column address strobe, to generate said count value equal to said base column address in response to said transition of said column address strobe, and to update said count value in response to each of said number of said subsequent transitions.

6. The memory device of claim 1 further comprising:

a control circuit coupled to said array;

a counter coupled to said control circuit, said counter operable to receive a base column address and a column address strobe, to generate a count value equal to said base column address, and to update said count value in response to each of a number of transitions of said column address strobe;

a column latch coupled to said control circuit and to said counter, said column latch operable to store said count value in response to each of said number of transitions of said column address strobe;

a column decoder coupled to said column latch and to said array and operable to fire a column of memory cells identified by said count value; and an output buffer coupled to said array and to said control circuit and operable to receive said column address strobe and to output data stored in one of said memory cells located in said fired row and a fired column in response to said number of said transitions following a first transition of said column address strobe.

7. A memory device, comprising:

an address bus;

a data bus;

a row-address-strobe line;

a prefetch-signal line;

an array of memory cells arranged in rows and columns, said array having a row-select input and a data output coupled to said data bus;

a row latch having an address input coupled to said address bus, a latch input coupled to said prefetch-signal line, and an output; and a row decoder having an address input coupled to said output of said row latch, a strobe input coupled to said row-address-strobe line, and an output coupled to said row-select input of said array.

8. The memory device of claim 7 further comprising:

an address buffer interposed between said row latch and said address bus, said address buffer having an address input coupled to said address bus, a first control input coupled to said prefetch-signal line, and an output coupled to said address input of said row latch; and a delay circuit interposed between said row latch and said prefetch-signal line, said delay circuit having a prefetch input coupled to said prefetch-signal line and a prefetch output coupled to said latch input of said row latch.

9. The memory device of claim 8 wherein:

said address buffer further includes a second control input coupled to said row-address-strobe line; and wherein said delay circuit is interposed between said row decoder and said row-address-strobe line and further includes a strobe input coupled to said row-address-strobe line and a strobe output coupled to said strobe input of said row decoder.

10. The memory device of claim 7 further comprising:

a column-address-strobe line;

a column latch having an address input coupled to said address bus, a latch input coupled to said column-address-strobe line, and an output;

said array having a column-select input; and a column decoder having an address input coupled to said output of said column latch and having an output coupled to said column-select input of said array.

11. The memory device of claim 7 further comprising:

said array having control and column-select inputs;

a column-address-strobe line;

a control circuit having a pair of inputs respectively coupled to said row-address- and column-address-strobe lines and having an output coupled to said control input of said array;

a column latch having an address input coupled to said address bus, a latch input coupled to said column-address-strobe line, and an output;

a column decoder having an address input coupled to said output of said column latch and an output coupled to said column-select input of said array;

a number of buffers interposed between said array and said data bus, each buffer having a data input coupled to said data output of said array, a select input, and an output coupled to said data bus; and a counter having a control input coupled to said output of said control circuit, an update input coupled to said column-address-strobe line, an address input coupled to said address bus, and a count output coupled to said select inputs of said buffers.

12. The memory device of claim 7 further comprising:

said array having column-select and control inputs;

a column-address-strobe line;

a control circuit having a pair of inputs respectively coupled to said row-address- and column-address-strobe lines and having an output coupled to said control input of said array;

a column latch having a count input, a latch input coupled to said column-address-strobe line, a control input coupled to said output of said control circuit, and an output;

a column decoder having an address input coupled to said output of said column latch and an output coupled to said column-select input of said array;

an output buffer interposed between said array and said data bus, said output buffer having a data input coupled to said data output of said array and having a latch input coupled to said column-address-strobe line; and a counter having a control input coupled to said output of said control circuit, an address input coupled to said address bus, and update input coupled to said column-address-strobe line, and a count output coupled to said count input of said column latch.

13. A computer system, comprising:

a data input device;

a data output device;

an address bus;

a data bus;

a row-address-strobe line;

a prefetch-signal line; and computing circuitry coupled to said data input and output devices, said data and address busses, and said prefetch and strobe lines, said computing circuitry including a memory device that includes, an array of memory cells arranged in rows and columns, said array having a row-select input and a data output coupled to said data bus, a row latch having an address input coupled to said address bus, a latch input coupled to said prefetch-signal line, and an output, and a row decoder having an address input coupled to said output of said row latch, a strobe input coupled to said row-address-strobe line, and an output coupled to said row-select input of said array.

14. The computer system of claim 13 wherein said memory device further comprises:

an address buffer interposed between said row latch and said address bus, said address buffer having an address input coupled to said address bus, a first control input coupled to said prefetch-signal line, and an output coupled to said address input of said row latch; and a delay circuit interposed between said row latch and said prefetch-signal line, said delay circuit having a prefetch input coupled to said prefetch-signal line and a prefetch output coupled to said latch input of said row latch.

15. The computer system of claim 14 wherein said memory device further comprises:

said address buffer further including a second control input coupled to said row-address-strobe line; and said delay circuit interposed between said row decoder and said row-address-strobe line and further including a strobe input coupled to said row-address-strobe line and a strobe output coupled to said strobe input of said row decoder.

16. The computer system of claim 13 further comprising:

a column-address-strobe line coupled to said computing circuitry; and wherein said memory device further includes, a column latch having an address input coupled to said address bus, a latch input coupled to said column-address-strobe line, and an output, said array having a column-select input, and a column decoder having an address input coupled to said output of said column latch and having an output coupled to said column-select input of said array.

17. The computer system of claim 13 further comprising:

a column-address-strobe line coupled to said computing circuitry; and wherein said memory device further includes, said array having control and column-select inputs, a control circuit having a pair of inputs respectively coupled to said row-address- and column-address-strobe lines and having an output coupled to said control input of said array, a column latch having an address input coupled to said address bus, a latch input coupled to said column-address-strobe line, and an output, a column decoder having an address input coupled to said output of said column latch and an output coupled to said column-select input of said array, a number of buffers interposed between said array and said data bus, each buffer having a data input coupled to said data output of said array, a select input, and an output coupled to said data bus, and a counter having a control input coupled to said output of said control circuit, an update input coupled to said column-address-strobe line, an address input coupled to said address bus, and a count output coupled to said select inputs of said buffers.

18. The computer system of claim 13 further comprising:

a column-address-strobe line coupled to said computing circuitry; and wherein said memory device further includes, said array having column-select and control inputs, a control circuit having a pair of inputs respectively coupled to said row-address- and column-address-strobe lines and having an output coupled to said control input of said array, a column latch having a count input, a latch input coupled to said column-address-strobe line, a control input coupled to said output of said control circuit, and an output, a column decoder having an address input coupled to said output of said column latch and an output coupled to said column-select input of said array, an output buffer interposed between said array and said data bus, said output buffer having a data input coupled to said data output of said array and having a latch input coupled to said column-address-strobe line, and a counter having a control input coupled to said output of said control circuit, an address input coupled to said address bus, and update input coupled to said column-address-strobe line, and a count output coupled to said count input of said column latch.

19. A method, comprising:

storing a row address in a latch in response to a transition of a latch signal; and selecting a row of memory cells identified by said row address in response to a transition of a row address strobe, said transition of said row address strobe occurring a first predetermined time after said transition of said latch signal.

20. The method of claim 19 wherein said latch signal comprises a prefetch signal.

21. The method of claim 19 further comprising:

coupling said row address to said latch in response to a transition of a prefetch signal; and generating said transition of said latch signal a second predetermined time after said transition of said prefetch signal.

22. The method of claim 19 further comprising:

storing a column address in response to a transition of a column address strobe; and selecting a column of said memory cells that is identified by said column address.

23. The method of claim 19 further comprising:

selecting a plurality of columns of memory cells, each column corresponding to a respective one of a plurality of column addresses that include a base column address and one or more additional column addresses that are indexed with respect to said base column address; and coupling to a data bus in response to each of a plurality of transitions of a column address strobe, data from a respective one of a plurality of memory cells that are located in said selected row and respective ones of said selected columns.

24. The method of claim 19 further comprising:

storing a base column address as an address value in response to a first transition of a column address strobe; and in response to each of one or more subsequent transitions of said column address strobe, coupling to a data bus data from a memory cell located in said selected row and in a column corresponding to said address value and updating said address value.

25. The method of claim 19 wherein said latch signal comprises a write-enable signal.

* * * * *